United States Patent [19]

Ristow

[11] 4,425,573

[45] Jan. 10, 1984

[54] METAL-SEMICONDUCTOR-FIELD EFFECT TRANSISTOR (MESFET) WITH LIGHTLY DOPED DRAIN CONTACT REGION FOR HIGHER VOLTAGE BREAKDOWN

[75] Inventor: Dietrich Ristow, Neubiberg, Fed. Rep. of Germany

[73] Assignee: Siemens Aktiengesellschaft, Berlin & Munich, Fed. Rep. of Germany

[21] Appl. No.: 324,978

[22] Filed: Nov. 25, 1981

Related U.S. Application Data

[62] Division of Ser. No. 38,895, May 14, 1979, Pat. No. 4,325,747.

[30] Foreign Application Priority Data

May 19, 1978 [DE] Fed. Rep. of Germany ....... 2821975

[51] Int. Cl.³ .......................................... H01L 29/80
[52] U.S. Cl. ....................... 357/22; 357/15; 357/55; 357/91
[58] Field of Search ................... 357/22, 15, 55, 56, 357/91

[56] References Cited

U.S. PATENT DOCUMENTS

| | | | |
|---|---|---|---|
| 4,002,927 | 1/1977 | Nakamura et al. | 357/22 |
| 4,037,169 | 7/1977 | Suzuki | 357/22 |
| 4,173,764 | 11/1979 | DeCremoux | 357/22 |
| 4,212,022 | 7/1980 | Beneking | 357/15 |
| 4,337,473 | 6/1982 | Nishizawa | 357/22 |

FOREIGN PATENT DOCUMENTS

| | | | |
|---|---|---|---|
| 2412949 | 8/1979 | France | 357/15 P |
| 53-82179 | 7/1978 | Japan | 357/22 S |

Primary Examiner—Joseph E. Clawson, Jr.
Attorney, Agent, or Firm—Hill, Van Santen, Steadman & Simpson

[57] ABSTRACT

A MESFET is disclosed wherein a gallium arsenide semiconductor material is doped. The doping magnitude differs in the source area, drain area, and in the gate area. An increase of the dielectric strength without an increase of parasitic resistances is provided. In the manufacture of the MESFET, shadowing techniques are employed to vary the doping magnitudes.

5 Claims, 6 Drawing Figures

METAL-SEMICONDUCTOR-FIELD EFFECT TRANSISTOR (MESFET) WITH LIGHTLY DOPED DRAIN CONTACT REGION FOR HIGHER VOLTAGE BREAKDOWN

This is a division of application Ser. No. 038,895, filed May 14, 1979 now U.S. Pat. No. 4,325,747.

BACKGROUND OF THE INVENTION

The invention relates to a metal-semiconductor-field effect transistor (MESFET).

Field effect transistors are known in which the gate electrode is supported directly on the semiconductor surface between the source area and the drain area and forms a metal-semi-conductor (Schottky) contact. Such field effect transistors are designated as MESFET's. Such a MESFET is built up, for example, on a semiconductor layer located on an insulating substrate, whereby the layer thickness generally amounts from 0.1 to 0.5 μm and the doping of this semiconductor material has a magnitude of about $10^{17}$ particles per $cm^3$. The contact areas for source and drain generally have a distance from one another of about 3 to 7 μm and a strip-shaped Schottky-contact area with a width of 0.5 to 2 μm lies between these two areas. Gallium arsenide is preferably considered as the semiconductor material for MESFET's. All the three areas have the same conductivity type.

For power MESFET's, the parasitic resistances at the contacts and in the semiconductor layer are to be kept small and a large voltage between source and drain area can be applied without an electrical puncture or breakthrough occurring in the semiconductor layer between these areas.

Up to now, this problem was solved in such manner that one provided a relatively thick semiconductor layer and applied the contact strip for the gate in a somewhat recessed area of the semiconductor layer. It was thereby achieved that the semiconductor layer has a small thickness below the contact strip serving as the gate required for the function of a MESFET. The thicker layer parts beyond the gate area contribute to a reduction of the parasitic resistances. It has likewise been suggested to provide both the source area as well as the drain area with an increased doping of, for example, $10^{18}$ particles per $cm^3$. Accordingly, the contact resistance between the material of the semiconductor layer and the contact metallization located thereon was reduced by the ohmic junction, the path resistance was reduced in the semiconductor layer, and higher voltages could be applied. Moreover, by so doing, the noise property could also be improved. Concerning this state of the art, the publications IEEE MT-24, 1976, 312–317; Proceedings of the 6th International Symposium concerning Gallium arsenide and Related Compounds, St. Louis (1976), Pages 262–270; and IEEE ED-24 (1977), 1129–1130 all incorporated herein by reference, are pertinent.

According to the IEEE ISSCC Digest of Technical Papers (1978), 118–119, incorporated by reference, good power MESFET's can also be achieved when the doping in the source area and in the drain area lies at only about $10^{17}$ particles per $cm^3$ and the thickness of the semiconductor layer is selected correspondingly large.

SUMMARY OF THE INVENTION

An object of the present invention is to optimize a MESFET, particularly of the last-mentioned type, when it functions as a power-MESFET.

This object is inventively achieved in a MESFET wherein the drain area or zone is less highly doped than the gate area and the gate area is less highly doped than the source area. In the manufacturing of such metal-semiconductor field effect transistor, a mask is applied over a portion of a surface of the semiconductor layer where the drain zone is to be formed. A portion of the semiconductor layer adjacent the covered surface portion thereof, (i.e., a portion adjacent to an edge of the mask), is stripped away so as to create a step at such mask edge. Ion implantation for doping of the semiconductor layer at the uncovered surface thereof is then carried out from a first direction while the mask covers the drain zone but not the source and gate zones (i.e., so that only the source and gate zones are doped). Next, ion implantation is carried out from a second direction (generally at an oblique angle to the first direction) so that only the source zone is doped. During this second ion implantation step, the gate zone is not doped because of the shadowing effect provided by the mask edge and, of course, the drain zone is not doped because it is still covered by the mask. Either prior to the application of the mask or after the removal of the mask, all three zones, drain, gate and source zones, are commonly doped. This common doping of all three zones can occur prior to the first implantation step (i.e., prior to the doping of only the source and gate zones) or after the second implantation (i.e., when the mask is removed). In this manner, the resultant MESFET has a source zone with greater doping than a gate zone thereof while such gate zone has a greater doping than a drain zone thereof.

The invention proceeds from the consideration that the largest electric field strengths which could lead to a puncture occur in the MESFET between the gate and the drain area. It is therefore advantageous to provide a lower doping concentration in this area. It was determined that the electric resistance between the gate and drain areas thereby resulting has a relatively small influence on the amplification effect, and comparatively smaller than a resistance between the gate and the source area. For this reason, a degenerated (N+) doping is also advantageous for the source area according to a feature of the invention. Thus, the doping condition $N_D < N_G < N_S$ is to be fulfilled for the three areas of the drain, of the gate and of the source which have distances from one another which lie at a few μm.

DESCRIPTION OF THE PREFERRED EMBODIMENTS

Figure 1:
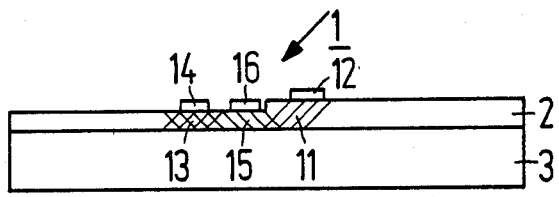
FIG. 1 shows a MESFET of the invention.

An inventive MES-field effect transistor located in a semiconductor layer 2 is designated 1. The semiconductor layer 2 preferably consisting of gallium arsenide is located on an electrically insulating substrate body 3. In particular highimpedance gallium arsenide or gallium arsenide which has been made semi-insulating is employed.

A drain area referenced with 11 is indicated by means of shading. On the drain area a metal contact referenced 12 is provided for the current supply. As a rule, the contact 12 is part of a printed line, for example, of a gold alloy, serving as a feed. An area of the semiconductor layer 2 functioning as a source area is noted by a further shading 13. A contact for this area is applied thereon corresponding to contact 12. 16 designates a metal strip, already mentioned above, which forms gate (Schottky) metal-semiconductor contact on the semiconductor layer 2. A gate area 15, which is again noted by means of shading and which functions as an electrical control, is formed beneath this metal strip 16. This results because the different potentials at the source and drain areas are different than the potential of strip 16.

According to the invention, a doping distribution is provided in the MESFET 1, for example, for gallium arsenide, in which the doping in the drain area 11 amounts to less than $10^{17}$ particles per $cm^3$. A doping of, for example, 1 to $4 \cdot 10^{17}$ particles per $cm^3$ is provided in the gate area 15. On the other hand, a doping of 1 to $8 \cdot 10^{18}$ particles per $cm^3$ is present in the source area 13. For a lower limit of the doping of the drain area 11, care must be taken that sufficient electrical conductivity is still present so that an unallowably large parasitic resistance does not occur. For the upper limit of the doping of the source area 13, care must be taken to see that the doping is not large such that crystal lattice defects compensate or at least negatively influence the intended doping. N doping for the areas or, respectively, regions is preferably provided, for example, for gallium arsenide.

As a rule, a lower doping of $10^{15}$ particles per $cm^3$ or less is to be provided beyond the areas 11, 13 and 15. There, however, a doping can also be completely omitted or the layer can be etched away.

The manufacture of a MESFET in accordance with the invention preferably ensues as follows.

Figure 2:
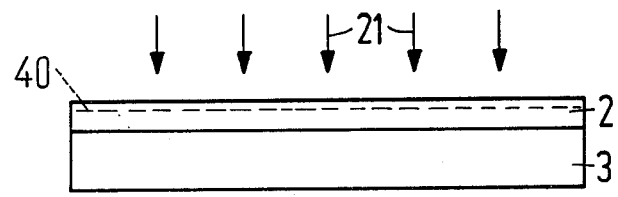
FIGS. 2 through 6 show individual process steps in manufacturing the MESFET.

FIG. 2 shows the aforementioned substrate body 3 on which the semiconductor layer 2 consisting of, for example, gallium arsenide, silicon, or indium phosphide is located. In a first process step, this semiconductor layer 2 is first doped to such a degree, for example, in the manufacturing process of layer 2 or by means of a succeeding diffusing-in or of an entire surface ion implantation, that the doping present for the drain area 11 is not more than $10^{17}$ particles per $cm^3$.

The arrows 21 indicate, for example, an ion implantation process for the production of the doping of this process step.

Figure 3:
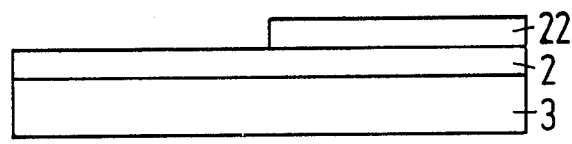

FIG. 3 shows the substrate body 3 with the semiconductor layer 2 located on it and upon which a coating or mask 22 is located which covers a portion of the surface of the semiconductor layer 2. Therefore, the area of the semiconductor layer 2 is covered in which the drain area 11 is located. This covering 22 can be produced with the assistance of a metal which is sputtered on or also by means of a photosensitive resist.

Figure 4:
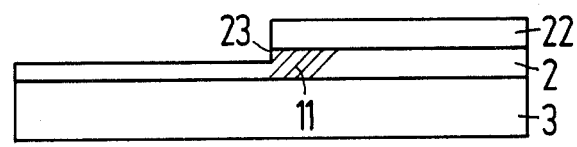

FIG. 4 shows the result of a further process by which a superficial erosion of the semiconductor layer 2 has been achieved. The thickness of the cut amounts, for example, to 20 nm. This leads to a step referenced 23 which, in a later processing step, serves as a recognition of the limit of the drain area 11 indicated by shading.

FIG. 5 again shows the substrate 3 with the semiconductor layer 2 located thereon and on which the coating 22 is still located. In the next process step, the semiconductor layer 2 is now further doped, in the area not covered by the covering 22, to the extent of the gate area doping of 1 to $4 \cdot 10^{17}$ particles per $cm^3$. This doping, for example, can again be undertaken with the help of an implantation. For this implantation, one must take care that no significant shadow effect ensues because of the covering 22. The implantation direction can be carried out as indicated by arrows 24 and 25 (and at directions lying inbetween).

The still higher doping of the source area with 1 to $10^{18}$ particles per $cm^3$ is undertaken in a further implantation step with an implantation direction as indicated by arrows 26. For this implantation direction corresponding to the arrows 26, care must be taken that, as a function of the thickness of the shadowing edge of the covering 22, the doping is such that the shadowing effect causes an intermediate space to remain as seen in step 26 (toward the left in FIG. 6) which is not further doped (gate area 15 of the transistor according to FIG. 1).

In further process steps—not illustrated—the covering 22 is then removed and the contacts 12, 14 and 16 are applied.

In the execution of the inventive manufacturing process with implantation in all process steps, only the implantation direction need be changed between the individual process steps, for example, by means of angular rotation of the substrate body on its carrier. The doping substance can always remain the same.

Figure 5:
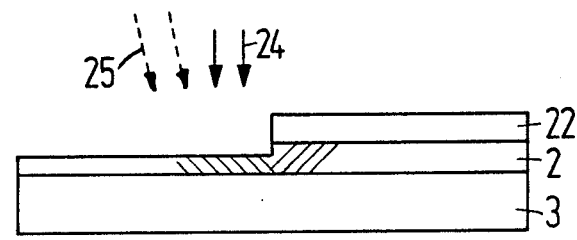
Figure 6:
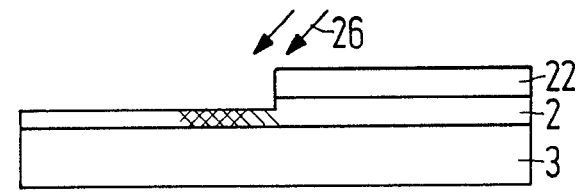

The manufacturing process of an inventive MESFET can be changed according to a variation of the manufacturing process described above in such manner that the sequence of the doping steps of FIGS. 2, 5 and 6 is interchanged. For example, the implantation 26 of the source area (FIG. 6) can be undertaken first with the implantation according to FIG. 5 then being undertaken subsequently. According to another variation, the implantation 21 corresponding to that of FIG. 2, for example, can be undertaken after the process step of FIG. 6, namely, after removal of the covering 22. One need only take care that the inventive doping steps respectively exist in the individual areas or, respectively, regions in the final result.

According to a further embodiment of the inventive MESFET or, respectively, of the inventive manufacturing process, during or after the process step of FIG. 2, a merely superficial implantation, i.e. an implantation 40 existing in the semiconductor layer 2 with only a minimum penetration depth as shown in dotted lines in FIG. 2 is undertaken which leads to a (superficial) high doping in the magnitude of 1 to $8 \cdot 10^{18}$ particles per $cm^3$. Such a superficial additional doping leads to a reduction of the contact resistance between the metal contact 12 and the otherwise weakly doped drain area 11. The penetration depth of this increased doping is selected, in particular, in such manner that it does not exceed the dimension of the step shown in FIG. 2, so that this increased surface doping, i.e. this highly doped semiconductor material of the surface layer of the semiconductor layer 2 is already removed again by means of the process step of FIG. 4 outside of the drain area. A residue of the highly doped surface layer can also be stripped immediately before the application of the metal strip 16.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A metal-semiconductor field effect transistor (MESFET), comprising: a semiconductor material having highly doped source, drain and gate areas therein; the three areas having the same conductivity type and the gate area being positioned between the drain and source areas and being less highly doped than the source area; and a doping of the drain area being lower than the doping of the gate area.

2. A metal-semiconductor field effect transistor according to claim 1 in which the semiconductor material comprises gallium arsenide.

3. A metal-semiconductor field effect transistor according to claim 1 in which the semiconductor material is a thin layer located on a substrate body, drain, gate, and source contacts are all located on a surface of the thin layer opposite the substrate body, and a step is provided on a surface of the layer between the drain and gate areas, the gate and source areas being located at a lower level of the step.

4. A metal-semiconductor field effect transistor according to claim 1 wherein the doping is N-doping.

5. A metal-semiconductor field effect transistor (MESFET), comprising: an insulating layer; a semiconductor layer arranged on the insulating layer; contiguous source, gate, and drain zones formed in the semiconductor layer which are all doped with the same conductivity type; electrodes positioned over each of the source, gate and drain zones; a doping of the source zone being greater than a doping of the gate zone and a doping of the gate zone being higher than a doping of the drain zone, the change of doping from the source to the gate and the gate to the drain zones being provided in a contiguous fashion.

* * * * *